United States Patent
Maezawa et al.

(10) Patent No.: US 6,630,630 B1
(45) Date of Patent: Oct. 7, 2003

(54) MULTILAYER PRINTED WIRING BOARD AND ITS MANUFACTURING METHOD

(75) Inventors: Satoshi Maezawa, Mie (JP); Masashi Tachibana, Hyogo (JP); Kazuya Oishi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 46 days.

(21) Appl. No.: 09/913,372

(22) PCT Filed: Dec. 13, 2000

(86) PCT No.: PCT/JP00/08803

§ 371 (c)(1), (2), (4) Date: Nov. 27, 2001

(87) PCT Pub. No.: WO01/45478

PCT Pub. Date: Jun. 21, 2001

(30) Foreign Application Priority Data

Dec. 14, 1999  (JP) .......................... 11-354307

(51) Int. Cl.$^7$ .................... H05K 1/11; H01R 12/04
(52) U.S. Cl. ............... 174/262; 174/255; 174/264; 174/261; 362/792; 362/795; 29/830; 29/831; 29/852
(58) Field of Search ............... 174/255, 262, 174/264, 261, 256, 258, 265; 361/792, 794, 795; 29/830, 831, 852, 846

(56) References Cited

U.S. PATENT DOCUMENTS

| | | | |
|---|---|---|---|
| 5,300,402 A | * 4/1994 | Card et al. | 430/280.1 |
| 5,457,881 A | * 10/1995 | Schmidt | 29/852 |
| 5,600,103 A | * 2/1997 | Odaira et al. | 174/265 |
| 5,699,613 A | * 12/1997 | Chong et al. | 29/852 |
| 5,736,681 A | * 4/1998 | Yamamoto et al. | 174/265 |
| 5,737,833 A | * 4/1998 | Motomura et al. | 29/830 |
| 5,865,934 A | * 2/1999 | Yamamoto et al. | 156/295 |
| 6,143,116 A | * 11/2000 | Hayashi et al. | 156/233 |
| 6,274,821 B1 | * 8/2001 | Echigo et al. | 174/255 |

FOREIGN PATENT DOCUMENTS

| | | | |
|---|---|---|---|
| JP | 8-18228 | * | 1/1996 |
| JP | 409064545 A | * | 3/1997 |
| JP | 410261870 A | * | 9/1998 |
| JP | 11-289165 | * | 10/1999 |
| JP | 11-298146 | * | 10/1999 |
| JP | 411298105 A | * | 10/1999 |

OTHER PUBLICATIONS

Japanese language search report corresponding to application No. PCT/JP00/08803 dated Mar. 27, 2001.*

* cited by examiner

Primary Examiner—Kamand Cuneo
Assistant Examiner—I B Patel
(74) Attorney, Agent, or Firm—RatnerPrestia

(57) ABSTRACT

A multilayer printed wiring board includes (a) an inner layer material that includes an insulating substrate, an inner conductive pattern formed of a metal foil and disposed on both sides of the insulating substrate, respectively, and an interstitial via hole, (b) an insulating resin disposed on both sides of the inner layer material, respectively, (c) an outer conductive pattern disposed on the surface of the insulating resin and (d) a surface via hole electrically connecting between the inner conductive pattern and the outer conductive pattern. The outer conductive pattern is formed of a metal foil with insulating resin comprising the insulating resin and a metal foil adhered to the insulating resin. An interstitial via hole has a conductive paste that is applied to a through hole. A surface via hole has a metal plating that is applied to a non-through hole. With this structure, the excellent ability to accommodate wiring is realized. The strength in adhesion between the insulating resin and the conductive pattern for outer layer is enhanced remarkably with a resulting contribution to maintaining an excellent components mounting strength even when a outer conductive pattern becomes small in dimension.

19 Claims, 3 Drawing Sheets

MULTILAYER PRINTED WIRING BOARD AND ITS MANUFACTURING METHOD

This application is a U.S. National Phase Application of PCT International Application PCT/JP00/08803 filed Dec. 13, 2000.

TECHNICAL FIELD

The present invention relates to a multilayer printed wiring board for various kinds of electronic equipment and its manufacturing method.

BACKGROUND ART

In recent years, as a higher degree of functionality and components density is required of electronic equipment such as personal computers, mobile telephones, video cameras and the like, it has become necessary for the electronic components used in the electronic equipment, among which semi-conductor devices occupy a central position, to be smaller in size, larger in packing density, higher in speed and/or higher in I/O pin count.

As a result, it has become also necessary for multilayer printed wiring boards to be enhanced in the ability to accommodate wiring and in the surface mounting density of components. In addition, as the diameter for each respective land for soldering becomes smaller, it has become necessary for the reliability in adhesion between the board and the components mounted thereon to be enhanced. More specifically, it has been required of a printed wiring board to have the capability of meeting both requirements of a high density as exemplified by a ball grid array (referred to as BGA hereafter) of a 0.5 mm pitch and a small diameter land of 0.3 mm or less. For example, such a printed wiring board that shows excellent resistance to mechanical stresses such as an impact caused by a drop test and the like has been increasingly demanded.

In order to meet the foregoing requirements, such a prior art multilayer printed wiring board as described below is proposed. The prior art multilayer wiring board comprises an inner layer material and a photosensitive resin or a film-like insulating layer, formed on each respective surface of both sides of the inner layer material. The inner layer material includes a resin multilayer printed wiring board and the respective layers in the resin multilayer printed wiring board are connected to one another electrically by means of interstitial via holes (IVH). The photosensitive resin or insulating layer is formed on each respective surface of both sides of the inner layer material by coating or lamination. Non-through holes are formed in the inner layer material and the layers inside thereof are electrically connected with one another by means of a metal plating method.

Next, a description is given to a manufacturing method of the foregoing prior art multilayer printed wiring board.

FIG. 3 shows how the prior art multilayer printed wiring board is prepared. In FIG. 3, an insulating layer 12 formed of a photo-sensitive resin and the like is disposed on the outer most layer of the prior art multilayer printed wiring board 15 by means of coating or lamination. The prior art multilayer printed wiring board 15 comprises a conductive pattern 11 for outer layer, a resin insulating layer 12, an inner layer material 13, a non-through hole 12a and a surface via hole (SVH) 11a. The inner layer material 13 includes an insulating substrate 14, a conductive pattern 14a for inner layer material, a copper foil 14d and a conductive paste 14b for inner layer material. The insulating substrate 14 is prepared from a prepreg 14c. The surface via hole 11a is formed by applying a metal plating to the non-through hole 12a formed in the resin insulating layer 12. In preparing the surface via hole 11a, the non-through hole 12a is formed by the use of such a method as a light exposure-development method, a laser irradiation method or the like applied to the resin insulating layer 12. The multilayer printed wiring board 15 has a conductive pattern inside and outside thereof, respectively. Now, a description is given to a manufacturing method of the multilayer printed wiring board structured as in above.

First, a hole making process is applied to a prepreg 14c in the step of FIG. 3(a). A conductive paste 14b is filled in the hole formed as in above. Then, a copper foil is superimposed on the prepreg 14c and heat pressed, thereby having the copper foil attached by adhesion to the prepreg 14c, in which a conductive paste 14b is filled. Accordingly, a copper laminated board with a copper foil disposed by lamination on both sides of an insulating substrate 14, respectively, is obtained. Thereafter, a conductive pattern 14a for inner layer material is formed by the use of such publicly known methods as a screen printing method, a photograph method and the like. Thus, the insulating substrate 14 with the conductive pattern 14a put in place on both sides thereof, respectively, is obtained.

In the step of FIG. 3(b), a prepreg 14c is prepared by filling a conductive paste 14b in a hole. The prepreg 14c filled with the conductive paste 14b is superimposed, respectively, on both sides of an insulating substrate 14 with a conductive pattern 14a formed on both surfaces thereof, respectively. Further, a copper foil 14d is superimposed on the surface of the prepreg 14c filled with the conductive paste 14b. Then, those laminates are heated by a heat press and a pressing force is applied thereto.

In the step of FIG. 3(c), the publicly known screen printing method, photographic method or the like is applied to the copper foil 14d put in place in the foregoing step of FIG. 3(b), thereby allowing a conductive pattern 14a to be further formed, respectively, on both surfaces of an inner layer material 13, which is consequently obtained as FIG. 3(c) shows.

Next, in the step of FIG. 3(d), a resin insulating layer 12 formed of a photosensitive type resin and the like is applied onto the inner layer material 13 so as to remain in a semi-hard state or the resin insulating layer 12 is laminated on the inner layer material 13.

Then, in the step of FIG. 3(e), a non-through hole 12a is formed at a predetermined position by the use of an exposure-development method, a laser irradiation method or the like.

In the step of FIG. 3(f), a conductive pattern 11 is formed on the resin insulating layer 12 and a surface via hole 11a is formed in the non-through hole 12a by metal plating. The surface via hole 11a has the function of connecting electrically between an inner layer conductive pattern and an outer layer conductive pattern. As a result, a multilayer printed wiring board 15 is obtained.

Afterwards, an application of a solder resist is performed by the use of such publicly known methods as a photographic method and the like and then working on the outside shape and the like follow.

With the foregoing prior art multilayer printed wiring board, the inner layer material has an interstitial via hole (IVH) formed on each respective layer at an arbitrary position and further has a small non-through hole ranging from about 50 μm to 100 μm in diameter formed on the outer layer thereof. Accordingly, the prior art multilayer printed wiring board has shown the excellent ability to accommodate wiring and to perform high density surface mounting. However, on the other hand, the prior art multilayer printed wiring board has revealed a flaw of weak adhesion between the conductive pattern 14a for outer layer and the resin insulating layer 12. In recent years, as a higher degree of ball grid array integration and a higher degree of components density are required, a land for soldering has become smaller and smaller in diameter and a requirement for enhanced adhesion between the conductive pattern 14a for outer layer and the insulating substrate 14 has been made.

More specifically, since a plated layer formed on a resin by metal plating shows weak adhesion therebetween, with the prior art multilayer printed wiring board 15, in which a conductive pattern 11 is formed on a resin insulating layer 12 by metal plating, the adhesion between the conductive pattern 11 formed on the resin insulating layer 12 and the resin insulating layer 12 is weak. As a result, when components are mounted densely on the multilayer printed wiring board 15 with a consequent use of small diameter lands for soldering, the conductive pattern 11 is liable to be peeled off the resin insulating layer 12 due to a mechanical stress, in particular.

In addition, the insulating substrate 14 constituting the inner layer material 13 and the insulating layer 12 constituting the outer most layer are different from each other in the hardening process, resulting in a big difference in physical properties existing therebetween. Therefore, the adhesion between the inner layer material and the outer most layer becomes weak. Also, there is the danger of causing cracks and delamination to be created between the inner layer material and the outer most layer due to the heat produced at the time of soldering in the step of mounting components since there exists a difference therebetween in thermal expansion coefficient.

The present invention provides a multilayer printed wiring board with such features as enhanced adhesion between the outer layer conductive pattern and the insulating layer and excellent mounting reliability against a mechanical stress imposed on highly integrated/densely populated components such as a ball grid array (BGA) of a 0.5 mm pitch and the like while maintaining the excellent features associated with the prior art multilayer printed wiring board in terms of the ability to accommodate wiring and the high density surface mounting.

SUMMARY OF THE INVENTION

A multilayer printed wiring board of the present invention comprises:

(a) an inner layer material comprising an insulating substrate, a inner conductive pattern which is formed of a metal foil disposed on each respective surface of both sides of the insulating substrate, and an interstitial via hole disposed on the insulating substrate;

(b) an insulating resin disposed on each respective surface of both sides of of the inner layer material;

(c) an outer conductive pattern disposed on the surface of the insulating resin; and (d) a surface via hole electrically connecting between the inner conductive pattern and the outer conductive pattern, in which the interstitial via hole connects electrically between respective inner conductive patterns among the plurality of inner conductive pattern-saterial, and the outer conductive pattern is formed of the metal foil of a metal foil with insulating resin, in which metal foil with insulating resin comprises the insulating resin and the metal foil adhered to the insulating resin.

A manufacturing method of a multilayer printed wiring board of the present invention comprises the steps of:

(a) producing an inner layer material, the inner layer material comprising an insulating substrate, an inner conductive pattern formed of a metal foil disposed on each respective surface of both sides of the insulating substrate and an interstitial via hole disposed on the insulating substrate;

(b) superimposing a metal foil with insulating resin on each respective surface of both sides of the inner layer material, in which the metal foil with insulating resin has an insulating resin and a metal foil adhered to the insulating resin,;

(c) applying a pressing force to the inner layer material and the metal foil with insulating resin superimposed on each respective surface of both sides of the inner layer material while heat being applied thereto, thereby allowing the insulating resin to adhere to the inner layer material;

(d) forming a non-through hole in the metal foil with insulating resin by working on the metal foil with insulating resin;

(e) forming a conductive pattern for outer layer by working on the metal foil exposed on the surface; and (f) connecting electrically between the outer conductive pattern and the inner conductive pattern.

As a result, a multilayer printed wiring board with the exceptionally excellent ability to accommodate wiring is realized. In addition, the adhesion between the outer conductive pattern and the substrate material is greatly enhanced. Therefore, even with a multilayer printed wiring board having respective lands provided with a small diameter is allowed to realize a high degree of components mounting reliability.

BEST MODE FOR CARRYING OUT THE INVENTION

Figure 1A:
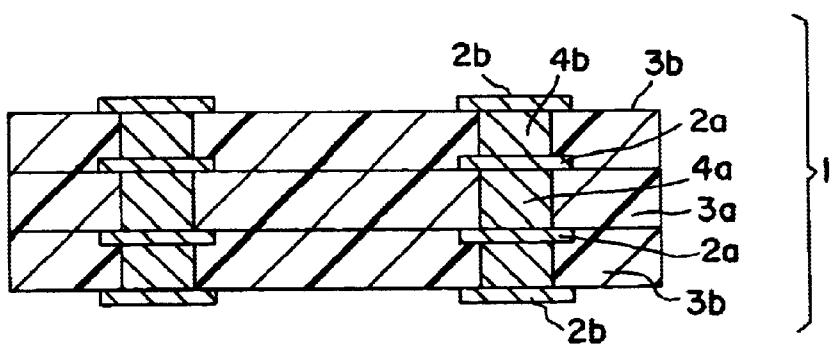
FIGS. 1(a) to 1(d) shows cross-sectional views of the production steps of a multilayer printed wiring board in an exemplary embodiment of the present invention.

With a multilayer printed wiring board in an exemplary embodiment of the present invention, an inner layer material comprises an insulating substrate and an inner conductive pattern disposed on each respective surface of both sides of the insulating substrate. The inner conductive patterns on the respective layers are electrically connected with one another by means of interstitial via holes (IVH). On both surfaces of the inner layer material are beforehand superimposed, respectively, a metal foil with insulating resin comprising a metal foil and an insulating resin which to has strong adhesion with the metal foil, and the resulting laminates are heated and pressed. Then, a non-through hole is formed on the metal foil with insulating resin and the inner conductive pattern and the outer conductive pattern are electrically connected with each other by a metal plating and the like. Accordingly, a multilayer printed wiring board with the exceptionally high ability to accommodate wiring is obtained. In addition, since the metal foil with insulating resin as described in above is employed as an outer layer material, the strength of adhesion between the insulating resin and the metal foil is intensified dramatically. As a result, even when the lands to connect to the outer conductive patterns are small in diameter, an excellent component mounting strength is allowed to be maintained.

A multilayer printed wiring board in an exemplary embodiment of the present invention comprises (a) an inner layer material formed of a base material impregnated with resin and provided with a through hole, a conductive paste filled in the through hole and an inner conductive pattern formed of a metal foil laminated on both surfaces of the base material, respectively, (b) an outer conductive pattern formed of the metal foil of the metal foil with insulating resin attached disposed on both surfaces of the inner layer material, respectively, and (c) a surface via hole disposed in the non-through hole formed on the metal foil with insulating resin for connecting between the outer conductive pattern and inner conductive pattern. The respective inner conductive patterns disposed on both surfaces of the base material are connected with each other by means of an interstitial via hole formed in a through hole. Accordingly, the exceptionally high ability to accommodate wiring is allowed to be realized. Furthermore, the strength of adhesion between the outer conductive pattern and the base material is intensified to an extreme extent, thereby allowing the respective lands with even a small diameter provided to a multilayer printed wiring board to attain a high degree of components mounting reliability.

A manufacturing method of a multilayer printed wiring board in another exemplary embodiment of the present invention comprises the steps of
(a) forming a through hole in a sheet like resin impregnated base material,
(b) filling a conductive paste in the through hole,
(c) superimposing a metal foil on both surfaces of the resin impregnated base material, respectively, and applying a pressing force thereto while heat being applied,
(d) forming a circuit by working on the metal foil and forming an inner conductive pattern on both surfaces of the base material, respectively, thereby forming an inner layer material,
(e) superimposing a metal foil with insulating resin on the outer most layer of each respective surface both sides of the inner layer material and applying a pressing force thereto while heat being applied,
(f) providing a non-through hole to the conductive pattern with insulating resin of the outer most layer and
(g) connecting electrically between the inner conductive pattern and the metal foil on the outer most layer via the non-through hole.

Accordingly, the respective inner conductive patterns disposed on both surfaces of the base material are electrically connected to each other by means of the conductive paste filled in the through hole.

It is preferred that the non-through holes are formed by laser beam machining.

It is preferred that a metal plating is applied to the non-through hole, thereby allowing the inner conductive pattern and the outer conductive pattern to be connected to each other. Thus, a surface via hole for outer layer can be formed readily on the land of an interstitial via hole for inner layer material, thereby achieving a remarkably high degree of the ability to accommodate wiring.

It is preferred that an insulating resin having sufficient adhesion to metal is used as the insulating resin for a metal foil with insulating resin. It is particularly preferred that the metal foil with insulating resin comprises a metal foil and an insulating resin applied by coating on the metal foil, thereby enhancing the adhesion strength between the outer conductive pattern and the insulating resin.

It is preferred that through holes and non-through holes are formed by laser beam machining, thereby allowing smaller diameter holes to be formed with a higher degree of productivity in comparison with a conventional drilling method.

It is preferred that, when a non-through hole is formed on a metal foil with insulating resin for outer most layer, an area of the metal foil, where the non-through hole is formed, is made free of the metal foil beforehand. Accordingly, a laser beam with a larger diameter than the diameter of the non-through hole is allowed to be used in laser beam machining. Therefore, it is no longer needed to make a positional adjustment in laser beam machining for each respective non-through hole, thereby allowing the small diameter non-through holes to be formed with a high degree of productivity.

It is preferred that the step of electrically connecting between the inner conductive pattern and the outer conductive pattern includes a process of applying a metal plating. The process of applying a metal plating reduces resistance between the conductive patterns and enhances the reliability of connection.

It is preferred that, in the step of forming a non-through on a metal foil with insulating resin for outer most layer, an area of the metal foil, where the non-through hole is formed, is made free of the metal foil in advance, thereby allowing the laser beam machining for forming the non-through hole to be performed with a laser beam of a larger diameter than the non-through hole's diameter with a resulting calibration of the displacements of the laser beams extending into the area where the metal foil is eliminated beforehand. Therefore, the non-through holes are formed correctly and accurately with reliability.

It is preferred that the resin, with which the base material is impregnated, is the same material as the insulating resin used in the metal foil with insulating resin. It is particularly preferred that the resin is an epoxy resin. Accordingly, the base material is prevented from warping after reflow soldering and also delamination between layers is prevented from taking place. In addition, heat resistance of the base material is enhanced.

It is preferred that the base material constituting an insulating substrate comprises an incompressible and porous base material formed of aromatic polyamide. In addition, the resin, with which the base material is impregnated, comprises a thermosetting resin, thereby contributing to a reduction in weight of a resulting multilayer printed wiring board and, further, to enhancement of heat resistance. As a result, the reliability of the multilayer printed wiring board is enhanced. Furthermore, the use of the incompressible and porous base material contributes to enhancement of the reliability in connection between conductor projections and a metal foil.

A multilayer printed wiring board in another exemplary embodiment of the present invention comprises
(a) an inner layer material having an insulating substrate, an inner conductive pattern formed of a metal foil disposed on both sides of the insulating substrate, respectively, and an interstitial via hole disposed on the insulating substrate,
(b) an insulating resin disposed on both sides of the inner layer material, respectively, (c) an outer conductive pattern disposed on the surface of the insulating resin and (d) a surface via hole to connect electrically between the inner conductive pattern and the outer conductive pattern.

The outer conductive pattern is formed of a metal foil with insulating resin comprising the insulating resin and a metal foil attached by adhesion to the insulating resin, the inner conductive pattern further has a conductor projection electrically connected to the wiring pattern for inner layer material and the conductor projection is connected to the outer conductive pattern by piercing through the insulating substrate. The conductor projection performs the function of the interstitial via hole.

It is preferred that the insulating substrate is formed of a base material and a sheet like resin prepreg containing a resin, with which the base material is impregnated, with a hardening process applied to the resin prepreg. The conductor projection pierces through the resin prepreg. The insulating resin has a non-through hole. In the non-through hole is formed the surface via hole.

A manufacturing method of a multilayer printed wiring board in still another exemplary embodiment of the present invention comprises the steps of (a) forming a cone or pyramid shaped conductor projection at a predetermined position of a metal foil, (b) stacking the metal foil and resin impregnated sheet like base material on top of each other with the metal foil's surface, where the conductor projection is located, made opposite to the base material and applying a pressing force thereto while heating, thereby having the resin impregnated base material pierced with the conductor projection to connect electrically between the metal foils disposed on both respective sides of the base material, (c) forming an inner layer material by working on the metal foil to form an inner layer conductive circuit that acts as an inner conductive pattern, (d) superimposing a metal foil with insulating resin on the inner layer material, (e) forming a conductive pattern for outer layer by working on the metal foil part of the metal foil with insulating resin, (f) forming a non-through hole by applying laser beam machining to the metal foil layer with insulating resin, and (g) providing a surface via hole for connecting between the outer conductive pattern and the inner conductive pattern. The conductor projection performs the function of an interstitial via hole.

According to the structure as described in above, enhancement of the freedom of designing a multilayer printed wiring board is realized, thereby allowing the production of multilayer printed wiring boards to be carried out with a simple manufacturing process to required specifications.

It is preferred that the non-through hole is formed by laser beam machining.

It is preferred that a metal plating is applied to the non-through hole, thereby allowing the inner conductive pattern and outer conductive pattern to be connected electrically with each other through a conductive layer formed by the metal plating.

Accordingly, a surface via hole of the outer layer is allowed to be formed readily on the land of the interstitial via hole of the inner layer material, thereby making it possible to achieve a remarkably high degree of the ability to accommodate wiring. In addition, the adhesion strength between the outer conductive pattern and the base material is extremely intensified, thereby enabling the realization of a high degree of components mounting reliability even with the use of small diameter lands.

It is preferred that the conductor projection is formed by hardening a conductive paste, thereby allowing many projections to be formed easily by a simple process. As a result, the configuration of each respective conductor projection is made uniform and stabilized, thus enabling the realization of a multilayer printed wiring board with stabilized interstitial via holes.

It is preferred that an insulating resin having sufficient adhesion to metal is used as the insulating resin for a metal foil with insulating resin. It is particularly preferred that the metal foil with insulating resin comprises a metal foil and an insulating resin applied by coating on the metal foil, thereby enhancing the adhesion strength between the outer conductive pattern and the insulating resin.

Next, a description is given to a few exemplary embodiments of the present invention with reference to drawings.

First Exemplary Embodiment

FIG. 1 shows cross-sectional views of the production steps of a multilayer printed wiring board in a first exemplary embodiment of the present invention. In FIG. 1, a multilayer printed wiring board 9 comprises an inner layer material 1, a metal foil with insulating resin 5, a outer conductive pattern 8 and a surface via hole (SVH) 7. The inner layer material 1 includes an insulating substrate 3, a inner conductive pattern 2 and a conductive paste 4. The metal foil with insulating resin 5 includes a non-through hole 6, which is formed by laser beam machining applied to the metal foil with insulating resin 5. The surface via hole (SVH) 7 is formed of a non-through hole 6 with a metal plating applied thereto. An interstitial hole (IVH) is formed in the inner layer material 1. The surface via hole (SVH) 7 is formed in an outer layer. All the layers have the conductive pattern 2 disposed thereon, respectively.

Next, a description is given to a manufacturing method of the multilayer printed wiring board constructed as described in above.

First, a resin prepreg 3 is prepared to form an insulating substrate for inner layer material. The resin prepreg 3 comprises an aramid non-woven fabric base material and an epoxy resin impregnated therewith. The resin prepreg is shaped like a sheet and in a semi-rigid state and also has incompressibility. In other words, the base material is porous and incompressible. An aramid fiber is a fiber formed of aromatic polyamide.

In FIG. 1(a), a through hole is formed in a resin prepreg 3a by $CO_2$ laser beam machining and then a conductive paste 4a is filled in the through hole, thereby forming a interstitial via hole. Thereafter, a copper foil is superimposed on both sides of the resin prepreg 3a, respectively. Thus, a copper-clad laminate before hardening is produced. Afterwards, a pressing force is applied to the copper-clad laminate before hardening while heat being applied thereto via a heating press, thereby having the copper foil adhered to the resin prepreg 3a and also having the prepreg 3a hardened. Thus, a copper-clad laminate comprising an insulating substrate 3a for inner layer material and a copper foil attached by adhesion on both sides thereof, respectively, is produced. Then, the copper foil of the copper-clad laminate is worked on according to a screen printing method or a photographic method, thereby forming a first inner conductive pattern 2a. The first inner conductive patterns 2a formed on both sides of the insulating substrate 3a are electrically connected to each other by means of the interstitial via hole provided with a conductive paste.

Next, another copper-clad laminate before hardening is superimposed on the insulating substrate 3a having the first inner conductive pattern 2a. The foregoing another copper-clad laminate before hardening comprises a resin prepreg 3b provided with a through hole, a conductive paste 4b filled in the through hole and a copper foil superimposed on the resin prepreg 3b. Then, the foregoing another copper-clad laminate before hardening is heat pressed, thereby having the copper foil attached by adhesion on the resin prepreg 3b and also having the resin prereg 3b hardened. Thereafter, the copper foil disposed on each respective outer side of the resin prepreg 3b is worked on according to a screen printing method or a photographic method to produce a second inner conductive pattern 2b. Thus, an inner layer material 1 as FIG. 1(a) shows is produced. A plurality of conductive patterns such as the first inner conductive pattern 2a, the second inner conductive pattern 2b and the like are connected electrically with one another by means of the interstitial via holes, each provided with a conductive paste.

Figure 1B:
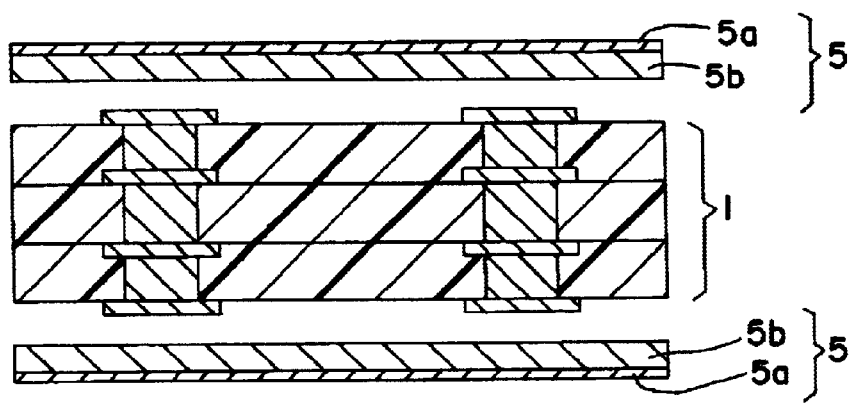

Next, in FIG. 1(b), a metal foil 5 with insulating resin is superimposed on both sides of the inner layer material 1, respectively. The metal foil with insulating resin 5 preferably comprises a metal foil 5a and an insulating resin 5b. It is also preferred that the metal foil with insulating resin 5 comprises the metal foil 5a and the insulating resin 5b in a semi-rigid state that is applied by coating on the metal foil 5a. The insulating resin 5b shows a strong adhesion against the metal foil 5a. A pressing force is applied to the inner layer material 1 and the metal foil with insulating resin 5 combined by lamination while heat being applied thereto by means of a heating press, thereby allowing the metal foil with insulating resin 5 to be attached by adhesion on the inner layer material 1 and also allowing the insulating resin 5b to harden.

It is preferred that, in the present manufacturing step, such a surface treatment as a surface-roughen treatment, a rust prevention treatment or a baking treatment is applied to the surface of the first inner conductive pattern 2a of the inner layer material 1 or the surface of the copper foil used in the preceding step thereof before the metal foil with insulating resin 5 and the inner layer material 1 are put together by lamination. As the surface-roughen treatment are utilized a soft etching method and the like. As a result, the adhesion between the first inner conductive pattern 2a and the metal foil with insulating resin 5 is enhanced remarkably. In addition, an internal stress created by differentials in thermal contraction existing between the inner layer material 1 and the metal foil with insulating resin 5 located on the outer most layer thereof is reduced, resulting in the prevention of cracks and further in the prevention of delamination from occurring between the inner layer material 1 and the metal foil with insulating resin 5.

It is further preferred that the insulating resin 5b of the metal foil 5 with insulating resin is formed of the same resin, i.e., epoxy resin, as used in the aforementioned insulating substrates 3a and 3b for inner layer material. Accordingly, the aforementioned internal stress is greatly reduced with a resulting contribution to the remarkable enhancement in an effect of preventing the creation of cracks and also preventing the delamination between layers from taking place.

Aramid fibers are preferably used in the base material for the insulating substrates 2a and 2b for inner layer material. The reasons for that are as follows:

(1) When a conventional base material of paper is used together with phenol resin, epoxy resin, polyester or the like as the insulating substrate for inner layer material, it is difficult for small through holes ranging from about 30 $\mu$m to 100 $\mu$m in diameter to be formed accurately by laser beam machining. Therefore, it is not practical to use the paper base material in terms of productivity.

(2) Aramid nonwoven fabrics show excellent laser beam machinability. More specifically, an insulating substrate using an aramid non-woven fabric base material allows a small through hole ranging from about 30 $\mu$m to 100 $\mu$m in diameter to be formed more accurately by laser beam machining in comparison with an insulating substrate prepared by the use of paper, glass nonwoven fabric or glass woven fabric. Further, in the step of filling a conductive paste in a through hole, the conductive paste filling work is allowed to be performed with stability. In addition, with the insulating substrate using a glass nonwoven fabric base material, a conductive paste can be filled in a small hole ranging from about 30 $\mu$m to 100 $\mu$m in diameter more accurately when compared with the case where a glass woven fabric base material is used in the insulating substrate.

(3) Even if a small non-through hole ranging from 30 $\mu$m to 50 $\mu$m in diameter can be formed on the outer most layer, it is impossible for the ability of a multilayer printed wiring board to accommodate wiring to be enhanced provided that a small through hole ranging from 30 $\mu$m to 50 $\mu$m in diameter is not allowed to be formed in the inner layer material. In contrast to the foregoing, when an aramid fiber nonwoven fabric is used as the base material for the insulating substrates 3a and 3b, a small through hole ranging from about 30 $\mu$m to 100 $\mu$m in diameter can be formed accurately and, further, a conductive paste can be filled in the through hole accurately.

(4) Since a metal foil 5 with insulating resin is disposed as the outer most layer, it is necessary to reduce the adverse effect of a thermal stress created at the boundary between the outer most layer and the inner layer material. The aramid fibers are strong in mechanical strength, high in heat resistance temperature, excellent in physical properties and also excellent in incompressibility and, therefore, the adverse effect of a thermal stress created at the boundary between the outer most layer and the inner layer material can be made minimal. As a result, a multilayer printer wiring board suitable for the practical use is made available.

(5) The nonwoven fabrics of aramid fiber show excellent incompressibility. Usually, as in the present exemplary embodiment, an inner layer material is formed by an application of a pressing force while heat being applied. Then, a metal foil 5 with insulating resin is superimposed on both surfaces of the inner layer material, respectively, and a plurality of times of the heating press step, in which a pressing force is applied to the laminate of the inner layer material and metal foil 5 while heat being applied thereto, are repeated with resulting creation of an internal stress. However, when a prepreg comprising a base material of aramid nonwoven fabrics is used as in the present exemplary embodiment, the internal stress created can be relieved even if the prepreg is exposed to a plurality of times of the compression step of heating, pressing and the like. In addition, the resistance between the conductive pastes 4a and 4b of the inner layer material 1 and the conductive patterns 2a and 2b of copper foil can be reduced.

Figure 1C:
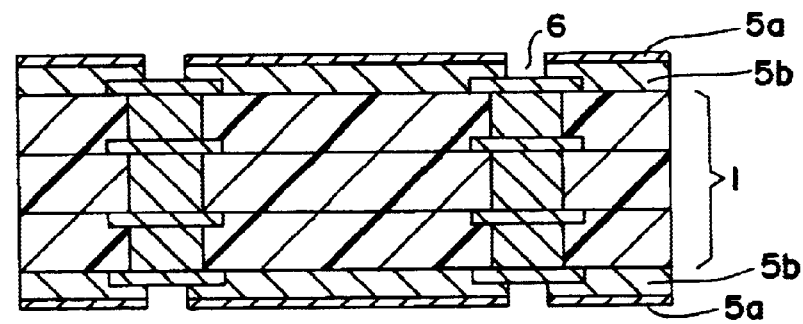

Next, in reference to FIG. 1(c), a photosensitive etching resist is applied on the entire surface of the metal foil with insulating resin 5, exposed to light and developed, thereby allowing the photosensitive etching resist to be eliminated from an area, where a non-through hole is formed. Thereafter, an area of the metal foil on the outer most layer, where the non-through hole is formed, is made free of the meal foil in advance by the use of an etching solution such as second copper chloride and the like. A hole having a diameter larger than the diameter required by the foregoing hole by 5% to 10% is formed by laser beam machining, thus obtaining a non-through hole 6.

Then, the inner walls of the non-through hole 6 is treated with a permanganic acid solution and the like to eliminate the exposed resin on the surface of the metal foil of the inner layer material 1. The foregoing process is repeated as many times as necessary.

Figure 1D:
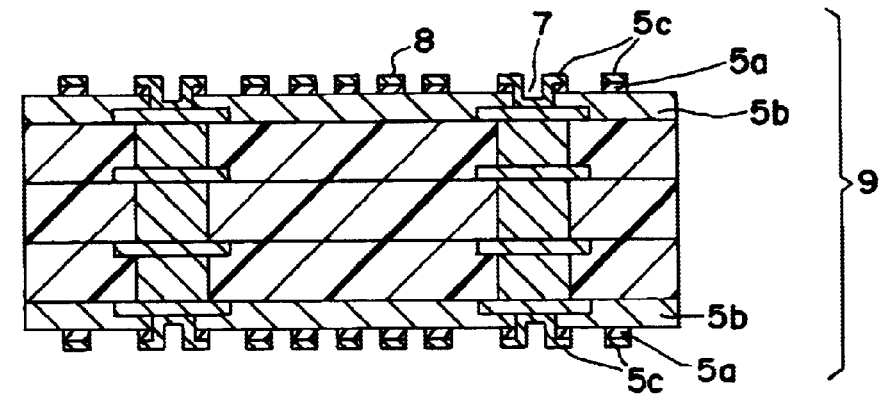

Next, in reference to FIG. 1(d), a metal plating layer is disposed on the entire surface of the metal foil 5a having the non-through hole 6 by means of electroless plating or electroplating. At this time, the metal plating layer is also formed on the walls of the non-through hole 6. Afterwards, a surface via hole (SVH) 7 and a conductive pattern 8 for outer layer are formed by such methods as a screen printing method, a photographic method and the like. Thus, a multilayer printed wiring board 9 is obtained. Further, the conductive patterns 2a and 2b for inner layer material and the conductive pattern 8 for outer layer are electrically connected with one another by means of the metal plating layer. Accordingly, the surface via hole (SVH) 7 is formed.

Furthermore, in the present exemplary embodiment, when a non-through hole ranges from 30 $\mu$m to 50 $\mu$m in diameter, a metal plating layer disposed on the walls of the non-through hole is probably buried under the metal plating layer itself. When the non-through hole ranges from 50 $\mu$m to 100 $\mu$m in diameter, about 50% of the metal plating layer disposed on the walls of the non-through hole may be buried under the metal plating layer itself. As a result, the adhesion strength between the surface via hole 7 and the insulating resin 5b is allowed to be intensified. In addition, it is also possible for the surface via hole (SVH) 7 to be used as the conductive pattern to form a soldering land for components mounting, thereby contributing to enhancement in components mounting density.

Although the inner layer material comprises a plurality of insulating substrates and a plurality of inner conductive patterns in the present exemplary embodiment, it is also possible for the inner layer material to employ a structure, in which the inner layer material comprises an insulating substrate and a inner conductive pattern disposed on both sides of the insulating substrate, without being limited to the aforementioned structure.

Second Exemplary Embodiment

Next, a description is given to a more specific exemplary embodiment of the present invention with reference to FIG. 1 used in the description of the foregoing first exemplary embodiment.

In FIG. 1, the interstitial via hole (IVH) formed in the inner layer material has a conductive paste in place of the metal plating layer, thereby allowing the land formed on the area, where the interstitial via hole is locate, to show excellent smoothness. As a result, the formation of a surface via hole (SVH) 7 on the land provided with the aforementioned smoothness is made possible easily by metal plating from the outer layer through the non-through hole 6 on the metal foil 5 with insulating resin. As the insulating resin 5b of the metal foil with insulating resin 5 is used an epoxy resin. On the other hand, to serve as a control example, an insulating layer is formed on both surfaces of the inner layer material as the outer most layer, respectively, and then a surface via hole (SVH) for the non-through hole and an outer conductive pattern are formed by metal plating. Thus, a multilayer printed wiring board is produced as the control example. The multilayer printed wiring board prepared according to the method employed in the present exemplary embodiment and the multilayer printed wiring board prepared according to the method employed in preparing the control example are compared in the adhesion strength between the insulating resin 5b and the metal plating layer 5c of the area where a surface via hole (SVH) is formed, and also in the adhesion strength between the insulating resin 5b and the outer conductive pattern 8. The results of the comparisons are summarized in Table 1.

Five samples each for the present exemplary embodiment and the control example are prepared for use in the comparison tests. The test method comprises the steps of melting a solder ball on a predetermined land and cooling the melted solder ball quickly, then pulling the solder ball at a shifting speed of 200 $\mu$m/sec and measuring the tensile strength required to pull the solder ball under the aforementioned state.

TABLE 1

|  | Non-through Hole Diameter ($\mu$m) | Land Diameter ($\mu$m) | Present Example | Control Example |
|---|---|---|---|---|
| Adhesion Strength between SVH & Insulator (Newton) | 50 | 150 | 0.96 | 0.49 |
|  | 75 | 175 | 1.12 | 0.54 |
|  | 100 | 200 | 1.37 | 0.61 |
| Adhesion Strength between Conductive Pattern & Insulator (N) | — | 150 | 0.74 | 0.15 |
|  | — | 175 | 0.88 | 0.22 |
|  | — | 200 | 1.25 | 0.36 |

As Table 1 shows, the multilayer printed wiring board prepared according to the method in the present exemplary embodiment has about two to five times the adhesion strength of the multilayer printed wiring board prepared according to the method of the control example in both the adhesion strength between the insulating resin 5b and the metal plating layer 5c of the area where a surface via hole (SVH) is formed and the adhesion strength between the insulating resin 5b and the conductive pattern 8 for outer layer.

Furthermore, in the present exemplary embodiment, the method of applying a pressing force to the insulating resin under a semi-rigid state while applying heat thereto by means of a heating press allows the step of applying the insulating resin by coating on the outer most layer to be performed with a smaller extent of variation in thickness and with excellent surface smoothness in comparison with the prior art method applying the insulating resin on the surface of the inner layer material by coating or by lamination.

Moreover, when the same resin as used in the resin prepreg of the insulating substrate is employed as the insulating resin 5b of the metal foil with insulating resin 5, such defects as warpage, degradation in heat resistance, delamination between layers and the like after solder reflowing are not at all recognized to have occurred with the resulting multilayer printed wiring boards. It is particularly preferred that an epoxy resin is used as the aforementioned resin.

As described in above, the multilayer printed wiring board in the present exemplary embodiment shows the remarkably excellent ability to accommodate wiring and further enhances extensively the adhesion strength between the insulating resin and the surface via hole (SVH) and also the adhesion strength between the insulating resin and the outer conductive pattern. Better still, even when components are mounted on small diameter lands, the components are allowed to be mounted accurately, thereby achieving a high degree of reliability.

Third Exemplary Embodiment

FIG. 2 shows the manufacturing steps for a multilayer printed wiring board in another exemplary embodiment of the present invention. A description is particularly given to the method for forming an inner layer material that is different from the method used in the first exemplary embodiment.

Figure 2A:
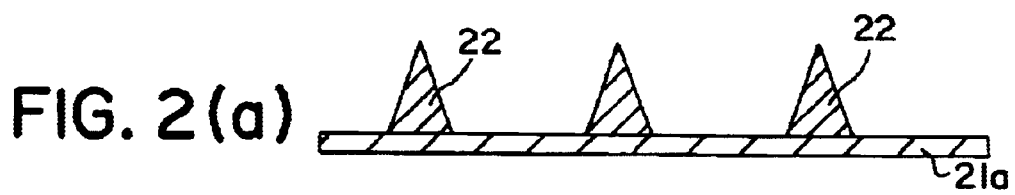
FIGS. 2(a) to 2(d) shows cross-sectional views of the production steps of a multilayer printed wiring board in another exemplary embodiment of the present invention.

In reference to FIG. 2(a), a cone or pyramid shaped conductor projection 22 is formed on a copper foil 21a at a predetermined position thereof by means of a printing method or a transferring method. It is preferred that the conductor projection 22 is formed of a conductive paste.

Figure 2B:
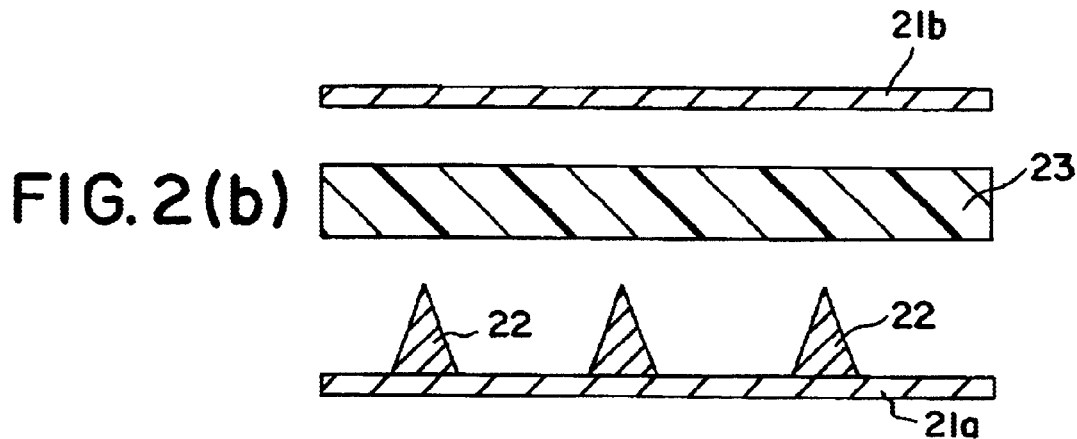

In reference to FIG. 2(b), a resin prepreg 23 is prepared to act as an insulating substrate for inner layer material. The resin prepreg 23 comprises an unwoven fabric base material of aramid fibers and an epoxy resin impregnated in the base material. The resin prepreg 23 thus formed is in a semi-rigid state. A second copper foil 21 b is superimposed on the upper surface of the resin prepreg 23 and a first copper foil 21a with the conductor projection 22 is superimposed on the lower surface of the resin prepreg 23.

Figure 2C:
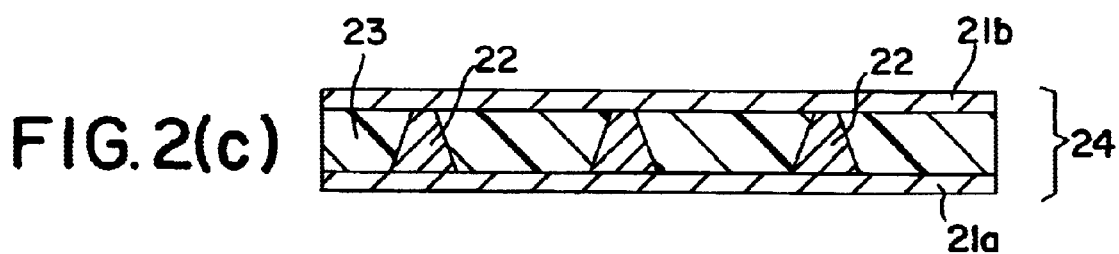

In reference to FIG. 2(c), a pressing force is applied to the first copper foil 21 a with the conductor projection 22, resin prepreg 23 and second copper foil 21b while heat being applied thereto. As a result, the conductor projection 22 pierces through the resin prepreg 23 and also the first copper foil 21a, resin prepreg 23 and second copper foil 21b are put together with one another by adhesion, and then the resin prepreg 23 is hardened, thereby finishing the formation of an insulating substrate of the resin prepreg 23. Thus, a laminated board 24 is produced.

Figure 2D:
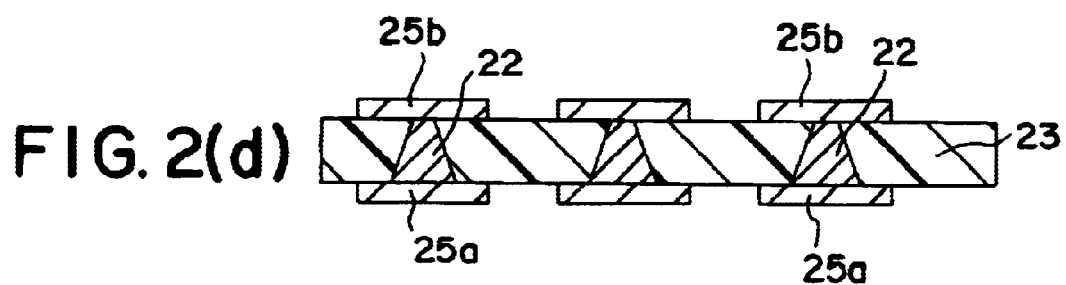
Figure 3A:
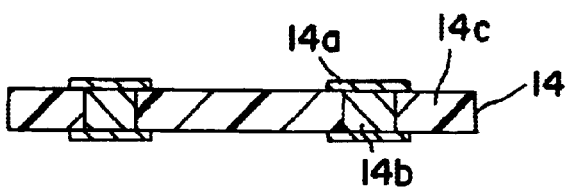
FIGS. 3(a) to 3(f) shows cross-sectional views of the production steps of a prior art multilayer printed wiring board.
Figure 3B:
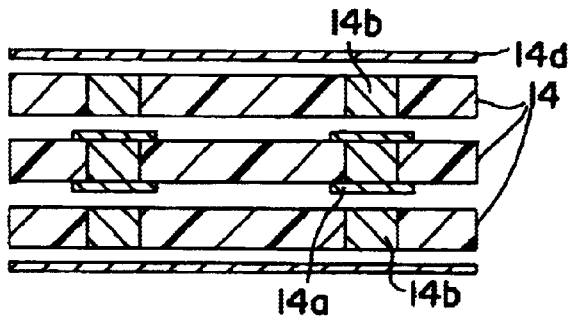
Figure 3C:
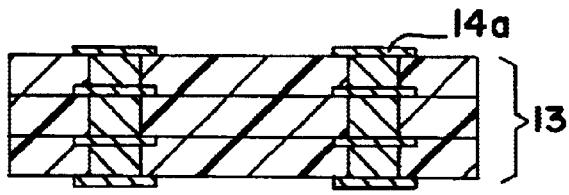
Figure 3D:
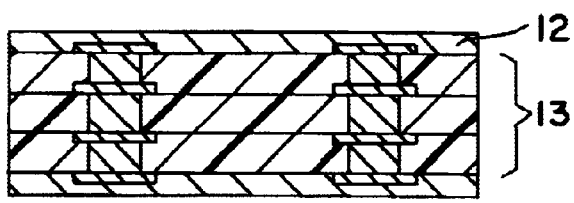
Figure 3E:
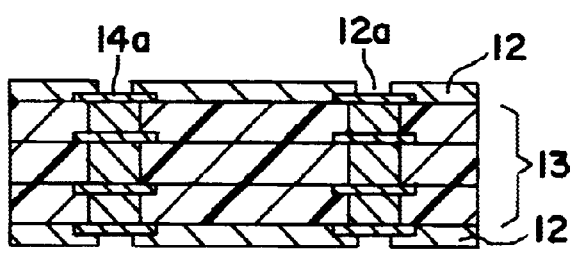
Figure 3F:
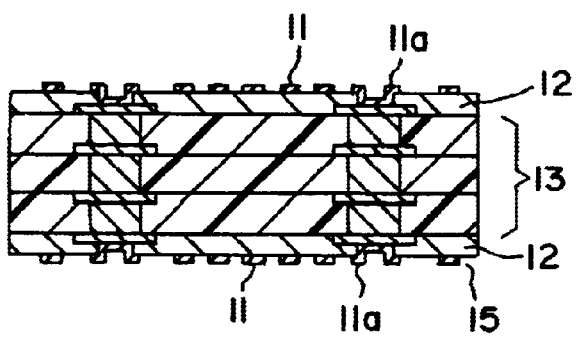

Then, in reference to FIG. 2(d), by working on the first copper foil 21a, a first inner conductive pattern 25a is formed and by working on the second copper foil 21b, a second inner conductive pattern 25b is formed. The first inner conductive pattern 25a is a first inner conductor circuit 25a and the second inner conductive pattern 25b is a second inner conductor circuit 25b. Thus, a inner conductor circuit 25 formed in the inner laminated board 24.

Thereafter, according to the same method as employed in the step of FIG. 1(b) of the first exemplary embodiment, a superimposing process of the metal foil with insulating resin 5 is performed. The metal foil with insulating resin 5 comprises a metal foil 5a and a semi-rigid insulating resin 5b applied by coating to the metal foil 5a. A pressing force is applied to the inner laminated board 24 and the metal foil with insulating resin 5 while heat being applied thereto by means of a heating press, thereby allowing the metal foil with insulating resin 5 to adhere onto the inner laminated board 24 and also allowing the insulating resin 5b to harden. Afterwards, the process of the same steps as described in FIG. 1(c) and FIG. 1(d) is performed, thereby finishing the production of a multilayer printed wiring board.

Although the multilayer printed wiring board in the present third exemplary embodiment comprises the first inner conductive pattern 25a and the second inner conductive pattern 25b disposed on both surfaces of the single laminated board 24, respectively, it is also possible for the multilayer printed wiring board with a plurality of the laminated boards 24 included therein to be produced without being limited to the aforementioned structure. In other words, according to the same method as employed in the step described in FIG. 1(a) of the first exemplary embodiment, an inner layer material having a plurality of the laminated boards 24 is produced. Furthermore, by repeating the steps as described in FIG. 2(b) and FIG. 2(c), the laminated board 24 is allowed to assume a further multilayered structure.

The methods as described in the first exemplary embodiment to the third exemplary embodiment allow multilayer printed wiring boards to be produced in accordance with required specifications by simple manufacturing steps. In addition, the multilayer printed wiring boards in the foregoing exemplary embodiments have the extremely excellent ability to accommodate wiring. Moreover, the strength in adhesion between a outer conductive pattern and a base material is remarkably enhanced. As a result, it becomes possible to realize a high degree of components mounting reliability even with a multilayer printed wiring board comprising lands that are small in diameter.

INDUSTRIAL APPLICABILITY

According to the structure disclosed by the present invention, an inner layer material has an interstitial via hole (IVH) formed of a conductive paste and, therefore, a land of the interstitial via hole (IVH) of the inner layer material can be formed so as to have smoothness, thereby allowing a surface via hole (SVH) to be formed on the land easily by means of a metal plating method applied from an outer layer. As a result, the ability of a resulting multilayer wiring board to accommodate wiring is enhanced extensively. Furthermore, since the insulating resin used in a metal foil with insulating resin shows strong adhesion against metal, the strength in adhesion between the insulating resin and the metal foil is enhanced dramatically, thereby allowing an excellent component mounting strength to be maintained even when the outer conductive pattern is reduced in diameter.

What is claimed is:

1. A multilayer printed wiring board comprising:
   (a) a plurality of inner conductive patterns alternating with a plurality of interstitial via holes;
   (b) respective insulating layers, one of said insulating layers above a top one of said inner conductive patterns, another below a bottom one of said conductive patterns;
   (c) respective outer conductive patterns formed on respective outer surfaces of said insulating layers; and
   (d) respective surface holes formed in each of said insulating layers to expose said top one and bottom one of said inner conductive patterns, each of said surface holes filled with plating material in contact with said outer conductive patterns.

2. The multilayer printed wiring board according to claim 1,
   wherein said insulating substrate is formed by hardening a sheet like rein prepreg, said sheet like resin prepreg including a base material and a resin impregnated to said base material,
   said insulating substrate has a through hole,
   said interstitial via hole has a conductive paste that is filled in said through hole,
   said insulating resin has a non-through hole, and
   said surface via hole is formed in said non-through hole.

3. The multilayer printed wiring board according to claim 2,
   wherein said resin contained in said insulating substrate includes a same material as said insulating resin.

4. The multilayer printed wiring board according to claim 2,
   wherein said resin contained in said insulating has a thermosetting resin, and
   said base material is formed of aromatic polyamide and has incompressibility and a porous structure.

5. The multilayer printed wiring board according to claim 2,
    wherein said base material has a nonwoven fabric formed of aromatic polyamide fibers.
6. The multilayer printed wiring board according to claim 1,
    wherein said surface via hole has a metal plating applied to said non-through hole.
7. The multilayer printed wiring board according to claim 1,
    wherein said surface via hole has a metal plating applied to said non-through hole, and
    said conductive pattern for outer layer further has a metal plating disposed on a surface of said conductive pattern for outer layer.
8. The multilayer printed wiring board according to claim 1,
    wherein at least one of said non-through hole and said through hole ranges from about 80 $\mu$m to about 100 $\mu$m in diameter.
9. The multilayer printed wiring board according to claim 1,
    wherein said non-through hole and said through hole are formed by laser beam machining.
10. The multilayer printed wiring board according to claim 1,
    wherein said inner layer material comprises a plurality of insulating substrates, and each of said plurality of inner conductive patterns is disposed, respectively, on both sides of said each respective insulating substrate.
11. A method of manufacturing a multilayer printed wiring board, said method comprising the steps of:
    (a) preparing an inner layer material, said inner layer material comprising
        a plurality of inner conductive patterns alternating with a plurality of interstitial via holes;
    (b) providing respective insulating layers, one of said insulating layers above a top one of said inner conductive patterns, another below a bottom one of said conductive patterns;
    (c) forming respective outer conductive patterns on respective outer surfaces of said insulating layers;
    (d) forming respective surface holes in each of said insulating layers to expose said top one and bottom one of said inner conductive patterns, and
    (e) filling said surface holes with plating material in contact with said outer conductive patterns.
12. The manufacturing method of a multilayer printed wiring board according to claim 11, wherein said inner layer material includes an insulating substrate,
    a method for preparing said inner layer material comprises the steps of:
        (I) forming a through hole in a sheet like resin prepreg comprising a base material and a resin impregnated to said base material,
        (II) filling a conductive pastr in said through hole,
        (III) superimposing a metal foil on both sides of said resin prepreg having said conductive paste, respectively,
        (IV) applying a pressing force to said resin prepreg having said conductive paste with said metal foil superimposed thereon while heat being applied thereto,
            thereby forming said insulating substrate as a result of hardening of said resin prepreg,
        joining said insulating substrate and said metal foil together by adhesion and
        forming said interstitial via hole as a result of hardening of said conductive paste, and
            (v) forming said inner conductive pattern by having said metal foil worked on.
13. The manufacturing method of a multilayer printed wiring board according to claim 12,
    wherein said through hole and said surface holes are formed by laser beam machining.
14. The manufacturing method of a multilayer printed wiring board according to claim 12,
    wherein said step of forming said surface holes comprises the step of:
        eliminating metal foil located on an area where said non-through hole is to be formed; and
        forming said non-through hole at a position where said metal foil is eliminated.
15. The manufacturing method of a multilayer printed wiring board according to claim 12,
    wherein at least one of said surface holes and said through holes range from about 30 $\mu$m to about 100 $\mu$m in diameter.
16. The manufacturing method of a multilayer printed wiring board according to claim 11,
    wherein said step of connecting electrically between said outer conductive patterns and said inner conductive patterns includes a step of applying a metal plating to said non-through hole.
17. The manufacturing method of a multilayer printed wiring board according to claim 11,
    wherein said step of forming surface holes on said metal foil with insulating resin further comprises the steps of:
        eliminating metal foil in an area where said non-through hole is formed; and
        forming said surface holes by irradiating a laser beam having a diameter larger than a diameter required of said non-through hole in said area where said metal foil is eliminated.
18. The manufacturing method of a multilayer printed wiring board according to claim 11,
    further comprising step of connecting electrically between said outer conductive pattern and said inner conductive pattern, said step further comprises the steps of:
        applying a metal plating to said surface holes; and
        applying metal plating on a surface of said outer conductive patterns.
19. The manufacturing method of a multilayer printed wiring board according to claim 11,
    wherein said step of forming said inner layer material includes a step of forming a plurality of insulating substrates and a plurality of inner conductive patterns, each of plurality of inner conductive patterns is disposed, respectively, on both sides of said each respective insulating substrate.

* * * * *

UNITED STATES PATENT AND TRADEMARK OFFICE
CERTIFICATE OF CORRECTION

PATENT NO. : 6,630,630 B1
DATED : October 7, 2003
INVENTOR(S) : Maezawa et al.

It is certified that error appears in the above-identified patent and that said Letters Patent is hereby corrected as shown below:

Title page,
Item [*] Notice, "46 days" should read -- 18 days --.

Column 15,
Line 19, "about 80 µm" should read -- about 30 µm --.

Signed and Sealed this

Twenty-third Day of November, 2004

JON W. DUDAS
*Director of the United States Patent and Trademark Office*